(12) United States Patent
Hussein et al.

(10) Patent No.: US 6,774,037 B2
(45) Date of Patent: Aug. 10, 2004

(54) METHOD INTEGRATING POLYMERIC INTERLAYER DIELECTRIC IN INTEGRATED CIRCUITS

(75) Inventors: Makarem A. Hussein, Beaverton, OR (US); Ruth Brain, Portland, OR (US); Robert Turklot, Hillsboro, OR (US); Sam Sivakumar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 91 days.

(21) Appl. No.: 10/150,617

(22) Filed: May 17, 2002

(65) Prior Publication Data

US 2003/0216057 A1 Nov. 20, 2003

(51) Int. Cl.[7] .................................................. H01L 21/44
(52) U.S. Cl. ........................ 438/666; 438/673; 438/780
(58) Field of Search .............................. 438/666, 673, 438/780, 978, 574, 579, 638, 738, 740, 702

(56) References Cited

U.S. PATENT DOCUMENTS

| | | | |
|---|---|---|---|
| 4,352,724 A * | 10/1982 | Sugishima et al. | ..... 204/192 E |
| 5,612,254 A | 3/1997 | Mu et al. | |
| 5,739,579 A | 4/1998 | Chiang et al. | |
| 5,817,572 A | 10/1998 | Chiang et al. | |
| 6,037,255 A * | 3/2000 | Hussein et al. | ............. 438/675 |
| 6,156,642 A * | 12/2000 | Wu et al. | ................... 438/637 |
| 6,197,681 B1 * | 3/2001 | Liu et al. | ................... 438/637 |
| 6,245,683 B1 * | 6/2001 | Liu | ............................. 438/702 |
| 6,274,483 B1 | 8/2001 | Chang et al. | |
| 6,329,118 B1 | 12/2001 | Hussein et al. | |
| 6,346,474 B1 | 2/2002 | Liu | |
| 6,350,681 B1 | 2/2002 | Chen et al. | |
| 6,372,631 B1 * | 4/2002 | Wang et al. | ................. 438/624 |
| 6,406,995 B1 * | 6/2002 | Hussein et al. | ............. 438/638 |
| 6,432,811 B1 * | 8/2002 | Wong | ......................... 438/619 |
| 6,495,448 B1 * | 12/2002 | Lee | ............................. 438/624 |
| 6,689,695 B1 * | 2/2004 | Lui et al. | .................... 438/700 |

OTHER PUBLICATIONS

Thompson, H.W. et al., "Etch Process Development for FLARE™ For Dual Damascene Architecture Using A $N_2/O_2$ Plasma," IEEE, 1999.

Vanhaelemeersch, C., et al., "Dry Etching of Low K Materials," IEEE 1999.

* cited by examiner

Primary Examiner—Erik J. Kielin
Assistant Examiner—David S. Blum
(74) Attorney, Agent, or Firm—Blakely, Sokoloff, Taylor & Zafman LLP

(57) ABSTRACT

A method of integrating a polymeric interlayer dielectric. The method comprises forming a dielectric layer comprising a polymer on a conductive layer formed on a substrate. A sacrificial hard mask is then formed on the dielectric layer. A first photoresist layer is then patterned on the sacrificial hard mask to define a first etched region, which is formed through the dielectric layer while substantially all of the first photoresist layer is removed. A sacrificial fill layer then covers the sacrificial hard mask and fills the first etched region. A second photoresist layer is patterned over the sacrificial fill layer to define a second etched region which is formed through the sacrificial fill layer and the dielectric layer while substantially all of the second photoresist layer and the sacrificial fill layer are simultaneously removed.

22 Claims, 7 Drawing Sheets

METHOD INTEGRATING POLYMERIC INTERLAYER DIELECTRIC IN INTEGRATED CIRCUITS

BACKGROUND

1. Field

The present invention relates to methods for integrating polymeric interlayer dielectric in integrated circuits.

2. Discussion of Related Art

Integrated circuits are made by forming on a substrate, such as a silicon wafer, layers of conductive material that are separated by layers of a dielectric material. These layers of dielectric material are often referred to as interlayer dielectric (ILD). Vias may be etched in the dielectric layers, then filled with a conducting material to electrically connect the separated conductive layers.

Commonly used dielectric materials include silicon dioxide ($SiO_2$) and fluorinated glass. Although a thermally stable and mechanically strong, silicon dioxide has a relatively high dielectric constant. Demand for faster devices has resulted in smaller design rules and interconnects are becoming the limiting factor for device speed due to interconnect resistivity and delay performance. As well known, power dissipation due to resistance-capacitance (RC) becomes significant due to increased wiring capacitance, especially interline capacitance between the metal lines on the same level. Smaller line dimensions, due to stringent design rules and interconnects, increase the resistivity of the metal lines and the narrow interlines spacing increases the capacitance (C) between the lines. The speed of the device will increase as dimensions of ultra large-scale integration devices scale to smaller feature sizes (<0.25 $\mu$m) and larger die dimensions. But, the interconnect RC time delay of the metal interconnect will increasingly limit the performance of high speed logic chips.

Consequently, as currently practiced in the art, certain materials including various polymers that have a relatively low dielectric constant are used as dielectric materials in place of other convention high dielectric constant material such as silicon dioxide. When such materials are used in place of those with a higher dielectric constant, power dissipation due to resistance-capacitance (RC) delay may be reduced, which can enable a higher speed device.

BRIEF DESCRIPTION OF THE DRAWINGS

The invention will be understood more fully from the detailed description given below and from the accompanying drawings of various embodiments of the invention, which, however, should not be taken to limit the invention to the specific embodiments, but are for explanation and understanding only. In the drawings.

DETAILED DESCRIPTION OF THE PRESENT INVENTION

In the following description, for purposes of explanation, numerous specific details are set forth. It will be evident, however, to one skilled in the art that the embodiments of present invention may be practiced without these specific details. In other instances, specific apparatus structures and methods have not been described so as not to obscure the present invention.

This discussion describes an improved process for making an integrated circuit that uses a polymer based dielectric as an insulation layer formed between conductive layers.

Figure 1:
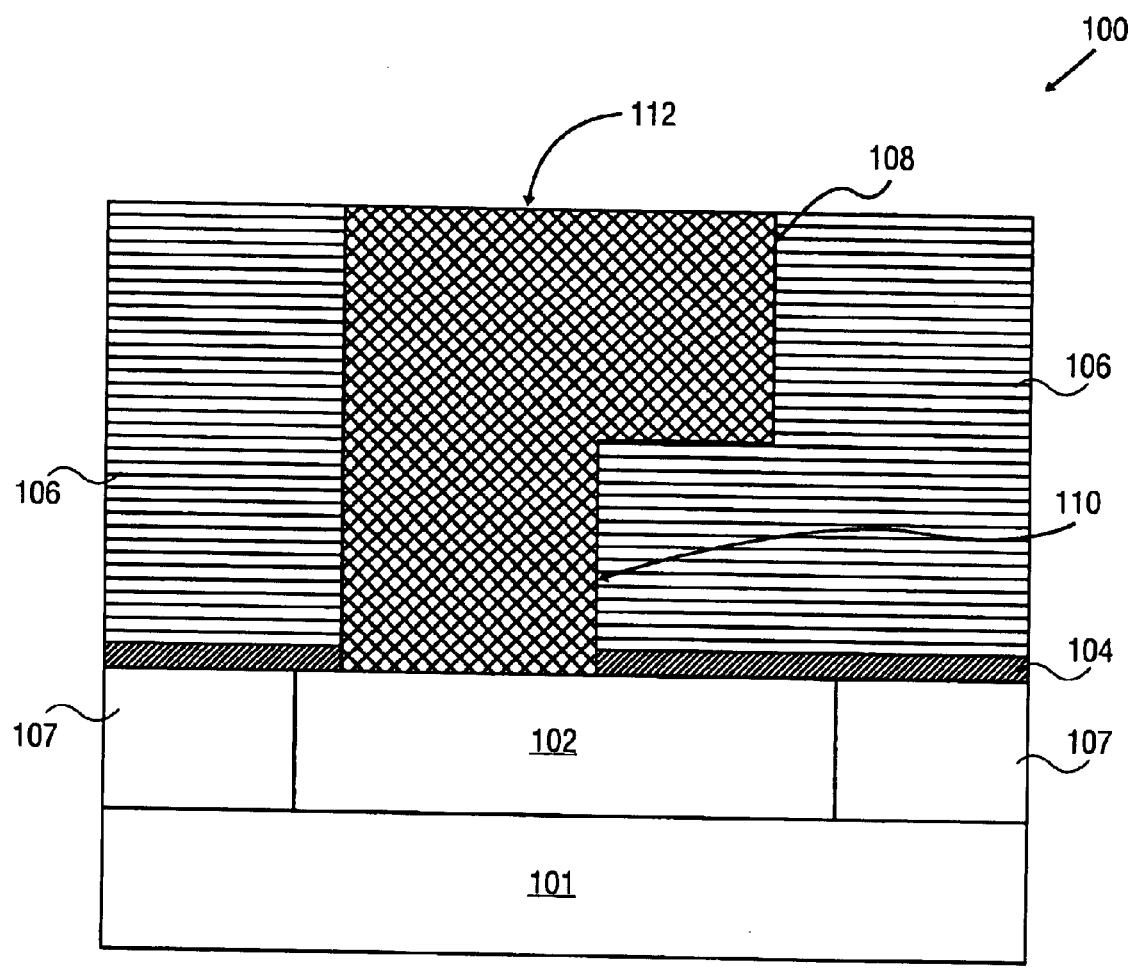
FIG. 1 illustrates a cross-section of an exemplary device that may be made using the methods discussed below.

FIG. 1 illustrates a cross-section of a device 100 that may be made using the methods described in this discussion. That device 100 includes a substrate 101. A first conductive layer 102 typically formed within a dielectric layer 107 that covers the substrate 101. An etch stop layer 104 covers the first conductive layer 102. A dielectric layer 106 comprising a polymer then covers the etch stop layer 104. A second conductive layer 112 fills a trench 108 and a via 110 which are created in the dielectric layer 106. As shown in the device 100, the second conductive layer 112 is coupled to first conductive layer 102. The coupling of the two conductive layers enables current to travel from one conductive layer to the other.

In one exemplary embodiment, the substrate 101 is any surface, generated when making an integrated circuit, upon which a conductive layer such as the first conductive layer 102 may be formed. The substrate 101 includes, for example, active and passive devices that are formed on a silicon wafer such as transistors, capacitors, resistors, diffused junctions, gate electrodes, local interconnects, etc. . . . In another embodiment, the substrate 101 also includes insulating materials (e.g., silicon dioxide, either undoped or doped with phosphorus (PSG) or boron and phosphorus (BPSG); silicon nitride; silicon oxinitride; or a polymer) that separate such active and passive devices from the first conductive layer or layers 102 that are formed on top of them. The substrate 101 may also include previously formed conductive layers.

In one exemplary embodiment, the first conductive layer 102 is made from materials conventionally used to form conductive layers for integrated circuits. Examples of such materials include copper, a copper alloy, aluminum or an aluminum alloy, such as an aluminum/copper alloy. Alternatively, the first conductive layer 102 is made from doped polysilicon or a silicide, e.g., a silicide comprising tungsten, titanium, nickel or cobalt. In another example, the first conductive layer 102 includes a number of separate layers. For example, the first conductive layer 102 may comprise a primary conductor made from an aluminum/copper alloy that is sandwiched between a relatively thin titanium layer located below it and a titanium, titanium nitride double layer located above it. Preferably, the first conductive layer 102 comprises a copper layer formed on an underlying barrier and seed layers. The conductive layer 102 may be formed from various other materials not mentioned in this discussion that can serve to conduct electricity within an integrated circuit. Although copper is preferred, the use of any other conducting material, which may be used to make an integrated circuit, falls within the spirit and scope of the present invention.

Figure 3:
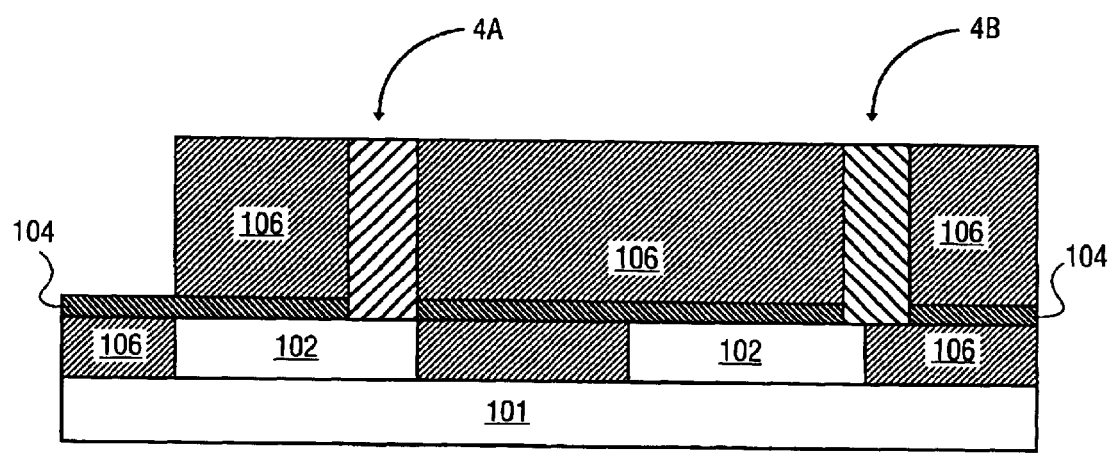
FIG. 3 illustrates an exemplary difference between a landed via and an unlanded via.

FIG. 1 illustrates that the etch stop layer 104 covers the first conductive layer 102. In one exemplary embodiment, the etch stop layer 104 inhibits diffusion into the dielectric layer 106 of copper or other elements that may be included in the first conductive layer 102. Additionally, the etch stop layer 104 performs an etch stop function—a function which may be particularly desirable if a via etched in or into the overlying dielectric layer is unlanded. For an example of unlanded and landed via, see FIG. 3 which illustrates an exemplary difference between a landed via and an unlanded via. A landed via is a via that completely lands (all cross section area) on top of a prior conductive layer (e.g., the first conductive layer 102) as shown in via 4A of FIG. 3. An unlanded via is a via that does not fully land on top of the prior conductive layer as shown in via 4B. Design rules typically allow no less than 50% of the cross section area of a via to contact the prior conductive layer. The use of an unlanded vias allows denser circuit layout and relaxes the registration (alignment of one layer with respect to another) requirements.

In another exemplary embodiment, the etch stop layer 104 preferably comprises silicon nitride, silicon carbide, or silicon oxynitride. The etch stop layer 104 may also be made of other materials that can inhibit diffusion from the first conductive layer 102 into dielectric layer 106 and provide high selectivity to etch chemistry used to etch a layer, or layers, formed on top of the etch stop layer 104. The etch stop layer 104 can be made out of titanium nitride and in such event, the etch stop layer 104 is patterned so that it only covers the area that has the first conductive layer 102 and it not continuous as shown in FIG. 1.

The etch stop layer 104 should be thick enough to perform such functions mentioned above, but not so thick that it adversely impacts the overall dielectric characteristics resulting from the combination of the etch stop layer 104 and the dielectric layer 106. To balance these two factors, the thickness of the etch stop layer 104 is preferably less than about 10% of the thickness of the dielectric layer 106.

The dielectric layer 106 comprises a polymer, preferably one with a low dielectric constant. A preferred polymer is one with a dielectric constant of less than about 3.8 and more preferably is a polymer with a dielectric constant between about 1.2 and about 3.0. With the low dielectric constant of the polymer, the capacitance between various conductive elements that are separated by the dielectric layer 106 is reduced, when compared to the capacitance resulting from use of other conventionally used dielectric materials—such as silicon dioxide. The reduced capacitance may decrease the RC delay that would otherwise exist and may also decrease undesirable cross-talk between adjacent conductive lines.

In another exemplary embodiment, the dielectric layer 106 comprises an organic polymer. Such organic polymers include, for example, polyimides, parylenes, polyarylethers, polynaphthalenes, and polyquinolines, or copolymers thereof. A commercially available polymer sold by Dow Chemicals under the trade name SiLK™ or those sold by Honeywell International, Inc., under trade names FLARE™, GX3 and GX3P may be used to form the dielectric layer 106.

In yet another embodiment, the dielectric layer 106 is preferably etched at substantially the same etch rate for the photoresist used to create the via 110 and the trench 108. Furthermore, the dielectric layer 106 preferably has good adhesion characteristics to the interconnect metal of choice.

In a preferred embodiment, the dielectric layer 106 has a thickness of between about 2,000 and about 20,000 angstroms. Although several examples of materials that can be used to make dielectric layer 106 have been identified here, any polymer that may insulate one conductive layer from another is within the spirit and scope of the present invention.

As shown in FIG. 1, the trench 108 and the via 110 are filled with the second conductive layer 112. In one exemplary embodiment, the second conductive layer 112 comprises any of the materials identified above in connection with the first conductive layer 102. In one embodiment, the second conductive layer 112 comprises the same conductive material as the first conductive layer 102. Alternatively, the second conductive layer 112 comprises a conductive material that is different from the material used to make the first conductive layer 102. In a preferred embodiment, the second conductive layer 112 comprises copper.

In another embodiment, when the second conductive layer 112 is formed from copper, the second conductive layer 112 is further formed on a copper diffusion barrier and seed layers (not shown) used to line the trench 108 and the via 110. The copper diffusion barrier layer may comprise a refractory material, such as titanium nitride or tantalum, but may also include an insulating material, such as silicon nitride. The barrier layer formed beneath the second conductive layer 112 is preferably between about 100 and 5000 angstroms thick. When an electroplating process is used to form the second conductive layer 112 from copper, a seed material may be deposited on the copper diffusion barrier layer prior to depositing the copper. Suitable seed materials for the deposition of copper include copper and nickel.

As with the first conductive layer 102, the second conductive layer 112 may be formed from various materials that can serve to conduct electricity within an integrated circuit. Furthermore, although the embodiment shown in FIG. 1 shows only one dielectric layer and two conductive layers, the number of conductive and dielectric layers included in the resulting integrated circuit may vary, as is well known to those skilled in the art.

Set forth below is a description of exemplary embodiments of the methods of making the device such as the device 100 shown in FIG. 1. The description is made with reference to FIGS. 2A to 2I, which illustrate cross-sections of structures that result after using certain steps.

Figure 2A:
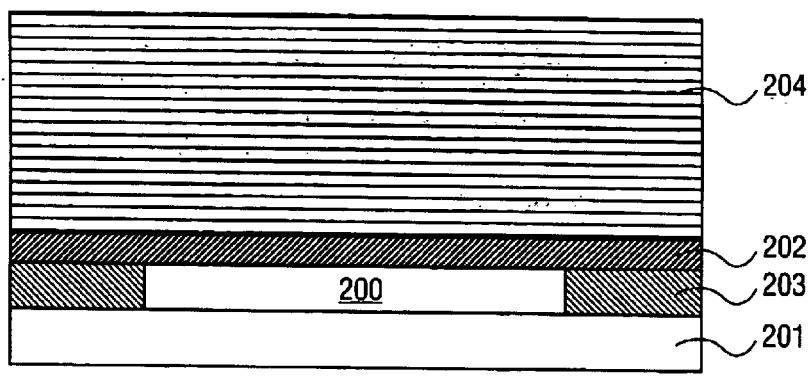
FIGS. 2A to 2J illustrates cross-sections that reflect exemplary structures that may result after certain steps are used, when making the device represented by FIG. 1.

As shown in FIG. 2A, a substrate 201 is first provided, which may already include many of the myriad of devices, materials and structures used to form integrated circuits. A first conductive layer 200 is then formed on substrate 201. The first conductive layer 200 is formed within the dielectric layer 203 using single damascene technique. Metal may be formed by a chemical vapor deposition or physical deposition process, like those that are well known to those skilled in the art. Alternatively, where copper is used to make the first conductive layer 200, a conventional copper electroplating process may be used. Such a process typically comprises depositing a barrier layer followed by depositing a seed material, then performing a copper electroplating process to produce the copper line, as is well known to those skilled in the art.

Continuing with FIG. 2A, after forming the first conductive layer 200 on the substrate 201, an etch stop layer 202 is formed on the first conductive layer 200. The etch stop layer 202 acts as a barrier for preventing subsequent via and trench etch steps from etching into an insulating material formed adjacent to the conductive layer 200. The etch stop layer 202 will serve to prevent an unacceptable amount of copper, or other metal, from diffusing into a polymeric dielectric layer. The etch stop layer 202 preferably is made from silicon nitride, but may be made from other materials that can serve such functions, as is well known to those skilled in the art. When formed from nitride, a chemical vapor deposition process such as plasma enhanced chemical vapor deposition using silane and ammonia may be used to form the etch stop layer 202.

Typically, the first conductive layer 200 is planarized using conventional polishing method such as chemical mechanical polishing (CMP) before the deposition of the etch stop layer 202.

A dielectric layer 204, which comprises a polymer, is then formed on top of the etch stop layer 202, preferably by spin coating the polymer onto the surface of the etch stop layer 202, using conventionally employed equipment and process steps. After the spin coating, the dielectric layer 204 is cured or baked as recommended by the manufacturer of the particular polymer used for the dielectric layer 204. The dielectric layer 204 is preferably between about 2,000 and 20,000 angstroms thick. In one example, the dielectric layer 204 is etchable by a plasma that contains a combination of nitrogen and hydrogen or a combination of nitrogen and oxygen.

FIG. 2A illustrates a cross-section of the structure that results after the first conductive layer 200, the etch stop layer 202, and the dielectric layer 204 have been formed on substrate 201.

Figure 2B:
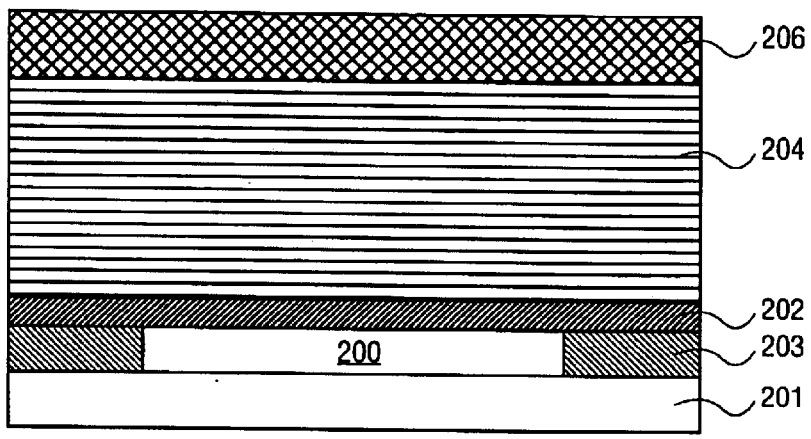

Continuing to FIG. 2B, after forming the dielectric layer 204, a sacrificial hard mask (SAM) 206 is formed on top of the dielectric layer 204. The SAM 206 is removed before the completion of the device (e.g., the device 100) that is made using the embodiments of this discussion. The SAM 206 is necessary to protect the dielectric layer 204 during the various etching processes to form the appropriate via and trench. In some cases, the SAM 206 is made from a material that has a dielectric constant higher than the dielectric layer 204. The higher dielectric constant of this material may counter effect the use of a low dielectric constant polymer to make the dielectric layer 204. The presence of the SAM 206 in the final device may degrade the overall low dielectric constant of the device. The presence of the SAM 206 in the final device thus does not optimize the advantage of the low dielectric constant characteristic of the polymer used to form the dielectric layer 204. Ultimately, the presence of the SAM 206 in the final device may degrade the overall performance of the device. Hence, the SAM 206 is removed before the final device is completed.

In one preferred embodiment, the SAM 206 is formed by spin coating. The minimum thickness required for the SAM 206 may be dictated by the thickness of the photoresist that is used in the via and the trench formation processes. A preferred thickness for the SAM layer 206 is between about 100 nm to about 500 nm. Preferred materials for the SAM 206 are various types of inorganic spin-on-glasses (SOG). A suitable material for the SAM 206 is a SOG that enables the SAM 206 to act as a buffer layer between the photoresist that is used to form the via and the dielectric layer 204. As will be apparent below, the SAM 206 protects the dielectric layer 204 during the via and trench etching processes. The presence of the SAM 206 is thus necessary during the fabrication process to protect the polymeric dielectric layer 204 by preventing the polymeric dielectric layer 204 from being improperly etched during the via and trench etching processes. Additionally, the SAM 206 is not etchable in the presence of a plasma that contains a combination of nitrogen and hydrogen or a combination of nitrogen and oxygen. Depending on etch process conditions, oxygen-nitrogen or hydrogen-nitrogen chemistry may conceivably erode the SAM 206 around the edges of open features. Furthermore, the SAM 206 may easily removed in a wet/dry chemistry that is selective to both the dielectric layer 204 and the copper in the conductive layer 200. An example of a wet chemistry that is selective to both the dielectric layer and copper includes reagents containing hydrogen fluoride (HF). An example of a dry chemistry that is selective to both the dielectric layer and copper includes reagents containing carbon fluoride ($C_yF_x$).

Example of material that can be used to make the SAM 206 includes various commercially available SOG such as SOG selected from ACCUGLAS series made by Honeywell International, Inc. Other exemplary materials that can be used for the SAM 206 include any silicate product, and a pure silicon oxide. Forming the SAM 206 is not limited to spin coating. Other techniques such as plasma deposition, chemical vapor deposition, and physical deposition, can be used to form the SAM 206 on the dielectric layer 204. FIG. 2B illustrates a structure with the SAM 206 formed on the dielectric layer 204.

Figure 2C:
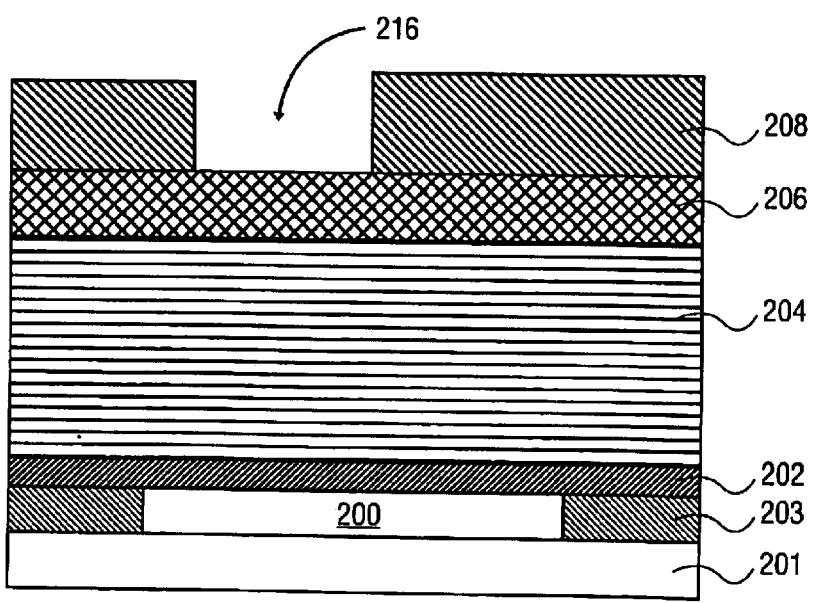

Continuing to FIG. 2C, a photoresist layer 208 is patterned on top of the SAM 206 to define a first etched region. The first etched region defines a region for a via. The via, when formed and filled with a conductive material, will allow signal propagation to the first conductive layer 200. In one exemplary embodiment, the photoresist layer 208 is patterned using conventional photolithographic techniques, such as masking the photoresist layer 208, exposing the masked photoresist layer 208 to light, and then developing the unexposed portions of the photoresist layer 208.

Figure 2D:
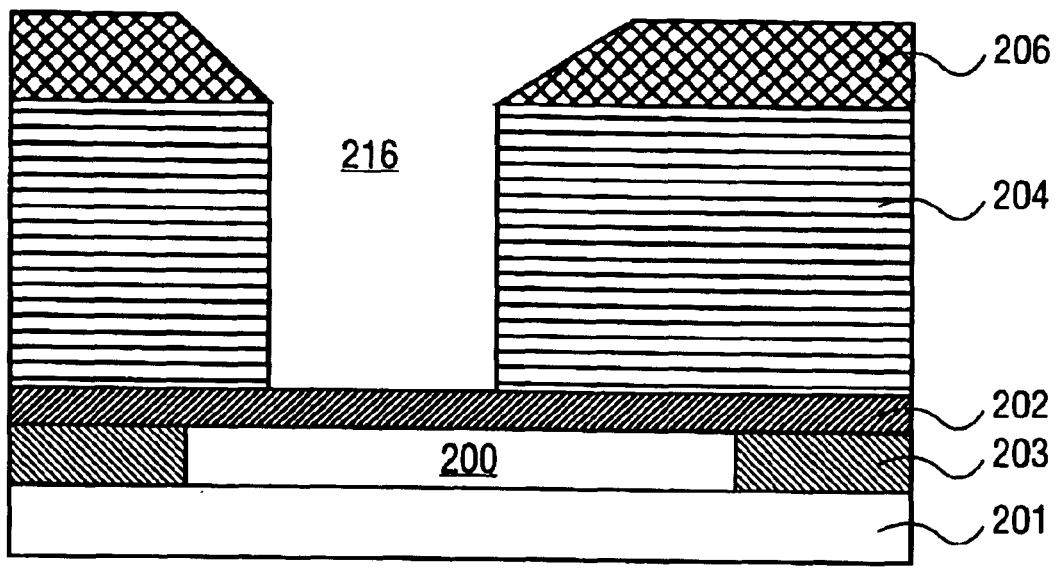

Continuing to FIG. 2D, after the photoresist layer 208 is patterned, a via 216 is etched in or into the SAM 206 and the dielectric layer 204 down to the etch stop layer 202. In one example, the formation of the via 216 is a two-step process: (1) the exposed section of the SAM 206 is anisotropically etched using a conventional dry chemistry etching process using a $C_xF_y$ or $C_xH_yF_z$ containing chemistry; and (2) after the SAM 206 is etched, the dielectric layer 204 is anisotropically etched using an all dry method, especially if the dielectric layer 204 comprises a polymer that is susceptible to damage when exposed to a wet clean process. Such a dry etch process may employ a plasma etch process that uses a plasma comprising a combination of nitrogen and hydrogen or a combination of nitrogen and oxygen. The dry etch process using the plasma that contains a combination of nitrogen ($N_2$) and hydrogen ($H_2$) or a combination of nitrogen ($N_2$) and oxygen ($O_2$) is preferred because such a dry etch process can remove both the photoresist layer 208 and the polymer in the dielectric layer 204. The via 216 created under this embodiment is etched in or into the dielectric layer 204 at the same time the photoresist 208 is removed. The resulting structure is as shown in FIG. 2D.

In another exemplary embodiment, an additional cleaning step may be necessary to clean residual materials such as polymer generated during the dry etch process used to form the first etched region 216. A polymer ILD and SAM 206 compatible chemistry is used to clean the structure shown in FIG. 2D.

In one embodiment, the etch chemistry described above may be used to simultaneously remove the photoresist layer 208 and the dielectric layer 204 at substantially the same rate. When such an etch chemistry is used, the photoresist layer 208 preferably is no thicker than the dielectric layer 204, to ensure that substantially all of the photoresist layer 208 is consumed when the via 216 is etched in or into the dielectric layer 204. If, on the other hand, an etch chemistry that is used to form the via 216 etches the dielectric layer 204 and the photoresist layer 208 at different rates, then a ratio of the photoresist layer thickness to dielectric layer 204 thickness can be selected that ensures removal of substantially all of the photoresist layer 208 when the via 216 is etched. When the photoresist layer 208 and the dielectric layer 204 are etched at the same time, the process of the present embodiment dispenses with otherwise necessary photoresist ashing and via clean steps.

As illustrated, the SAM 206 acts as a barrier to protect the dielectric layer 204, when the photoresist layer 208 is removed. Thus, only the exposed region of the dielectric layer 204, the region not protected by the SAM 206, is etched together with the photoresist layer 208.

Figure 2E:
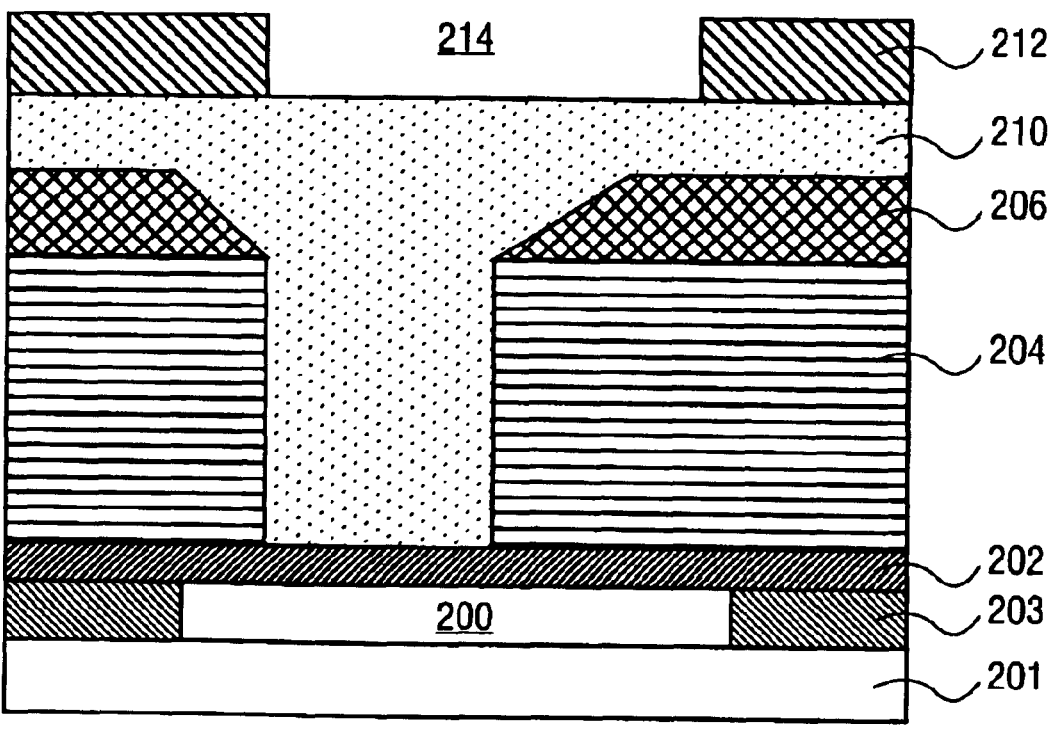

Continuing to FIG. 2E, after the via 216 is formed, a trench may be formed as follows: First, a sacrificial fill layer or a sacrificial via fill layer (SAVIL) 210 is formed. As shown in FIG. 2E, after the via 216 is formed in or into the dielectric layer 204, the via 216 is filled with the SAVIL 210. The SAVIL is then covered with a patterned photoresist layer 212 that defines a second region to be etched and this second region defines a trench 214 that is created at the end of this process.

In one exemplary embodiment, the SAVIL 210 as shown in FIG. 2E is used for the purpose of presenting a "hole-free" substrate during the trench photolithography process that is typically used to create the trench such as the trench 214. In another embodiment, the SAVIL 210 prevents erosion of the SAM 206 and ultimately, preserves the critical dimensions for the via 216 and the trench 214 during the trench etching processes. Erosion to the SAM 206 occurs when the etching reagents etches away a portion of the SAM 206 after the photoresist layer 208 is consumed, as illustrated in FIG. 2D. The removal of the photoresist layer 208 exposes the SAM 206 to the etching chemistry and causes erosion of open feature edges. The erosion of the SAM 206 thus leads to distortion of the dimension of the trench 214 and the via 216. Ultimately, the SAM 206 erosion leads to imprecise via and trench dimension and difficulty to control the critical dimension of the via 216 and the trench 214.

Additionally, control of the via and trench dimension is likely to be a problem if the trench etching process take place without the SAVIL filling the via. The presence of the SAVIL planarizes the wafer surface during trench lithography, and hereby, eliminates depth of focus control issues. Preservation of the via dimension is attained through the protection SAVIL provides to the edge of the via feature against ion bombardment during the plasma etching.

In one exemplary embodiment, the SAVIL 210 is made of an organic based polymeric material that fills the via 216 uniformly and planarizes the surface of the device for the trench lithographic process. Additionally, the SAVIL 210 material must be compatible with the photoresist layer 212 such that it provides surface that has optical characteristics compatible with the photoresist and it is removable by the same etch chemistry that is used to remove the photoresist layer 212. The SAVIL 210 must also be resistant to the photoresist developer chemistry used in treating the photoresist post exposure step. The SAVIL 210 must also be removable using wet chemistry with an etch rate significantly faster than the etch rate for the dielectric layer 204 using the same wet etch chemistry.

Returning to FIG. 2E, and as mentioned, the SAVIL 210 is chosen from a material that can planarize the surface of the structure during the trench formation process. The trench 214 can be formed by using a conventional photolithography technique. Topography variations caused by either photoresist thickness non-uniformity or underlying layers or SAM erosion will cause de-focus. Topography variations thus distort the pattern for forming the trench 214. The planarization characteristics of the material forming the SAVIL 210 allow the SAVIL 210 to compensate for the surface non-uniformity.

In one exemplary embodiment, the SAVIL 210 has dry etch properties similar to those of the dielectric layer 204. Preferably, the SAVIL 210 comprises a spin-on-polymer (SOP) or spin-on-glass (SOG) that is deposited by spin coating between about 500 and about 6,000 angstroms of the material onto the surface of the SAM 206 Furthermore, the SAVIL 210 completely and uniformly fills the via 216, using conventional process steps. Although only a thin layer remains on the surface of the device, such a spin coating process causes the SAVIL 210 to substantially, or completely, fill the via 216. In this embodiment of the present invention, the SAVIL 210 preferably should etch at a significantly faster rate than the dielectric layer 204, when subjected to a particular chosen wet etch chemistry.

In addition to having dry etch properties like those of the photoresist layer 206 and wet etch properties that allow it to etch significantly faster than the dielectric layer 204, the SAVIL 210 should uniformly fill the via 216, and have a dry etch rate comparable to that of the dielectric layer 204. Such dry etch properties should enable all proper etching of the dielectric layer 204 in the presence of the SAVIL 210 material to form the trench 214. With a wet etch rate that is significantly or substantially faster than the wet etch rate for the dielectric layer 204 the remaining portions of the SAVIL 210 that remain in the via 216 or on the SAM 206 after the dry etch step in the device after the etch step to form the trench 214 can be easily removed by a wet etch chemistry without affecting the dielectric layer 204. The selectivity of SAVIL 210 to the wet etch enables removal of that SAVIL material from the surface of the device, as well as the remaining portions of the SAVIL 210 inside the via 216 by wet etch chemistry when necessary. In one example, the SAVIL 210 has a wet etch rate that is at least ten times faster than the wet etch rate for the dielectric layer 204. And, the ability to fill the via 216 allows the SAVIL 210 to present a hole-free and uniform surface of the device to the photolithography process used to form the trench 214.

An example of a commercially available material that can be used to form the SAVIL 210 is selected from a series of SOG or SOP material. For example, the product with a trade name ACCUFLO by Honeywell International Inc., can be used. Other SOP and SOG can also be used so long as the material chosen can perform the functions of the SAVIL 210 described above.

Continuing with FIG. 2E, after filling the via 216 with the SAVIL 210, the photoresist layer 212 is applied on top of the SAVIL 210. The photoresist layer 212 is then patterned to define a second region to be etched; this second region defines the region for the trench 214 formation. The photoresist layer 212 is first patterned on top of the SAM 206 to define the trench formation region. The photoresist layer 212 may be patterned using conventional photolithographic techniques. After the photoresist layer 212 is patterned, the exposed portion of the SAVIL 210 is etched. In one exemplary embodiment, the SAVIL 210 is anisotropically etched using a $C_xF_y$ nitrogen-oxygen, nitrogen-hydrogen plasma containing chemistry. Following the etching of the exposed portion of the SAVIL 210, the exposed portion SAM 206 is etched. In one exemplary embodiment, the SAM 206 is also anisotropically etched using the same $C_xF_y$ containing chemistry.

Figure 2F:
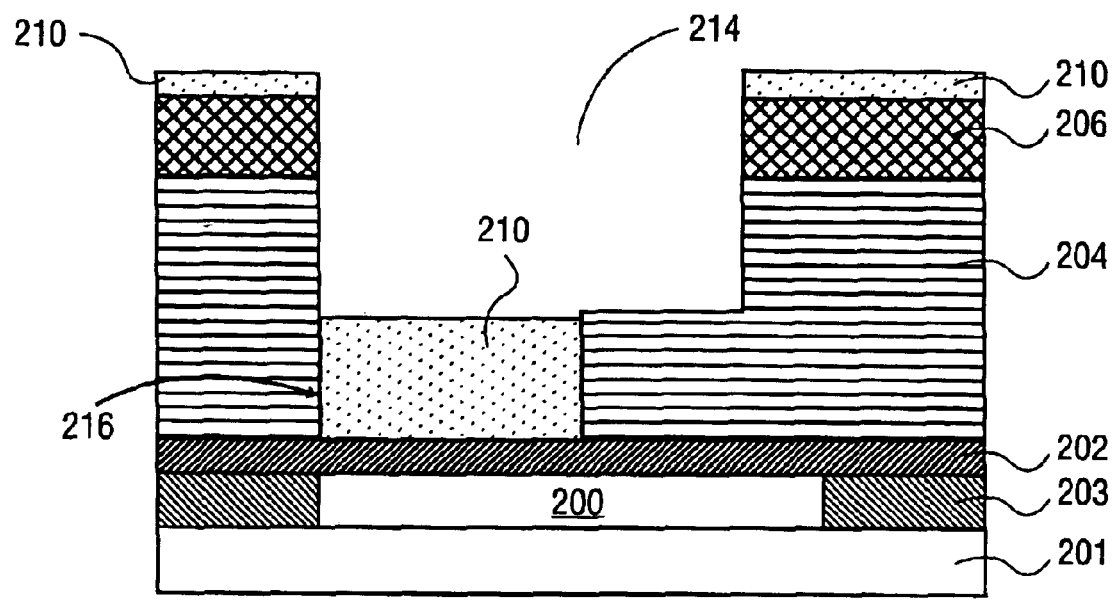

Continuing with FIG. 2F, following the photoresist patterning and the etching of the SAVIL 210 and the SAM 206, the trench 214 is formed. The same equipment and process steps used to etch the dielectric layer 204 when forming the via 216, may be used to etch the exposed portion of SAVIL 210, the SAM 206 and the dielectric layer 204 to define the trench 214. As described above, such a process may remove the photoresist layer at the same time the dielectric layer 204 is etched, which can obviate the need to subsequently ashing step to remove the photoresist or clean the trench to remove residual material (e.g., by applying the ashing technique to remove the photoresist material).

As with the via 216 formation step, when the photoresist layer 212 and dielectric layer 204 are made from materials that may be etched at substantially the same rate, the photoresist layer 212 preferably should be no thicker than the combined height of the trench 214 and the SAVIL layer on top water surface, to ensure substantially complete removal of photoresist material during the trench 214 formation step.

Figure 2G:
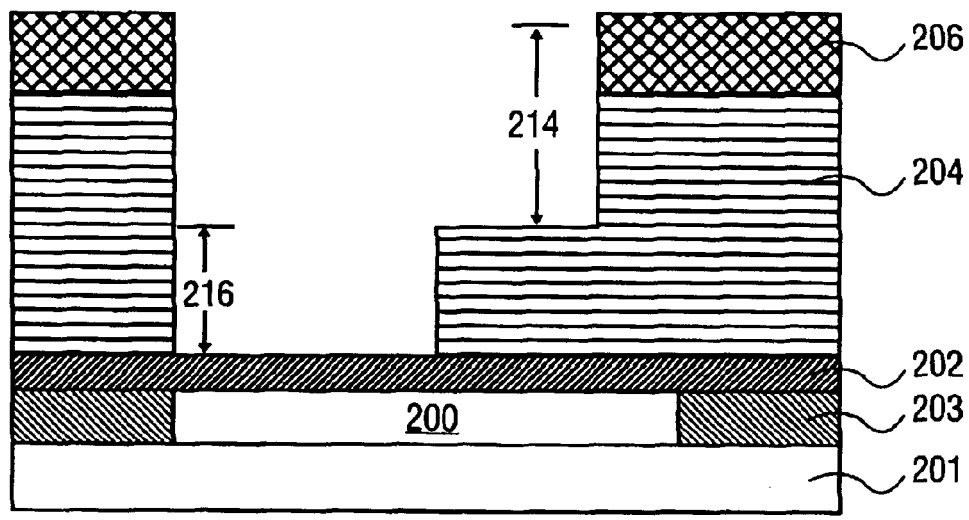
Figure 2H:
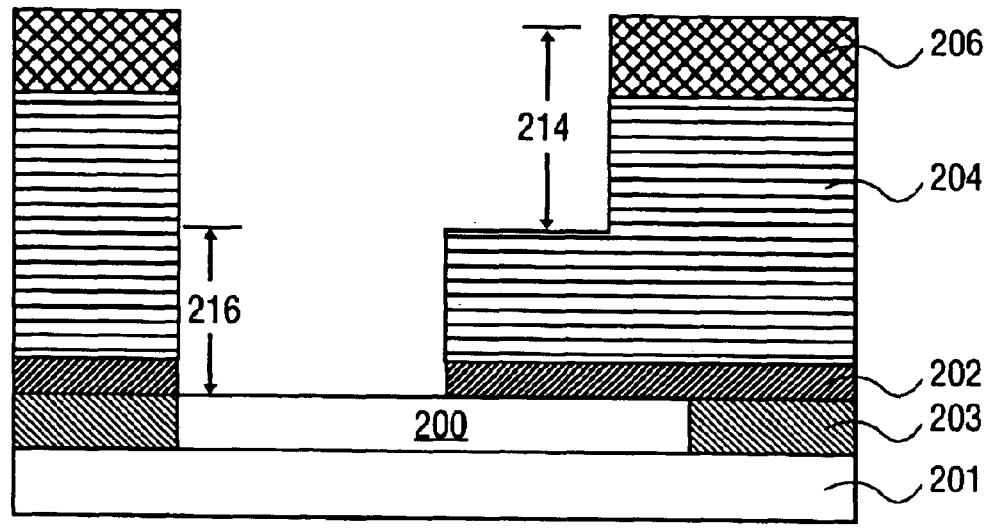
Figure 2I:
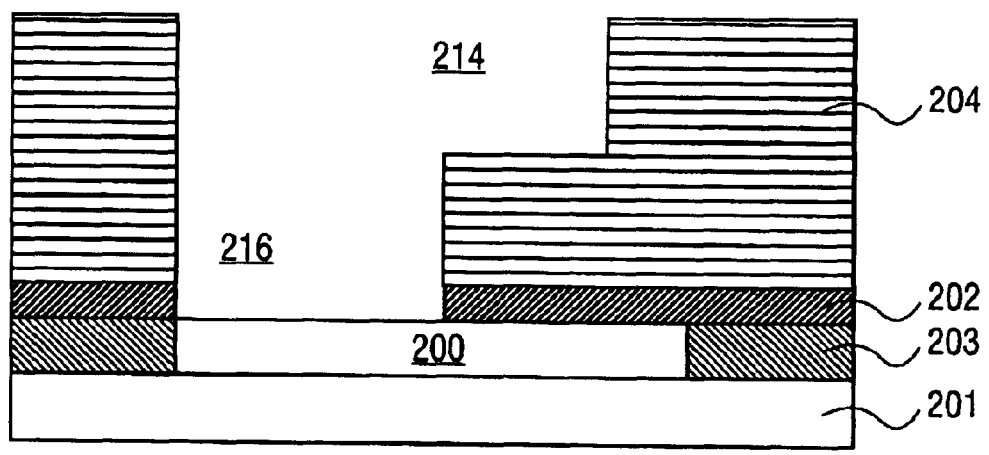

In another exemplary embodiment, a post trench etch cleaning step is used to clean any residual SAVIL material. As shown in FIG. 2F, some of the material from the SAVIL 210 may be remaining in the via 216 or on top of the SAM 206. The chemistry used to clean the trench 214 should be compatible with the dielectric layer 204 and the SAM 206. A wet etch chemistry may be used. As mentioned above, the SAVIL 210 is made of a material that has a wet etch rate that is significantly or substantially faster than that of the dielectric layer 204 (e.g., at least about ten times faster). In this embodiment, a wet etch chemical such as tetramethylammonium hydroxide (TMAH) or TMAH based chemistry can be used to clean the residual SAVIL 210 remaining in the structure shown in FIG. 2F. The resulting structure with the SAVIL 210 completely removed is shown in FIG. 2G.

In one exemplary embodiment, where the device includes an etch stop layer 202, the portion of the etch stop layer 202 within the via 216 is removed to enable contact from another conducive layer to the first conductive layer 200. One method that is used to etch this portion of the etch stop layer 202 is to use a $C_xF_y$ containing chemistry in a low power plasma to protect sputtering of the underline metal. For example, if a parallel plate, radio frequency etch system is used, then a power of about 200–1000 watt is used. If a high-density plasma system is used, then a low bias power is proper, e.g., about 0–100 watt. Selectivity to the dielectric layer 204 is of no concern since the dry etch chemistry likely to be used is inherently selective to the dielectric layer 204. In some cases, during the etching of this portion of the etch stop layer 202, part or all of the SAM 206 can also be etched away. After the etch stop layer 202 is etched, the resulting structure is that of the one illustrated in FIG. 2H.

After the trench 214 and the via 216 are etched, the SAM 206 is removed. The SAM 206 can be removed by wet etch chemistry or dry etch chemistry. In one exemplary embodiment, a wet chemistry such as a hydro fluoride (HF) containing reagent is used to remove the SAM 206. In another embodiment, a dry chemistry such as a $C_xF_y$ containing chemistry is used to remove the SAM 206. After the SAM 206 is removed, the resulting structure is that of the one illustrated in FIG. 2I.

Figure 2J:
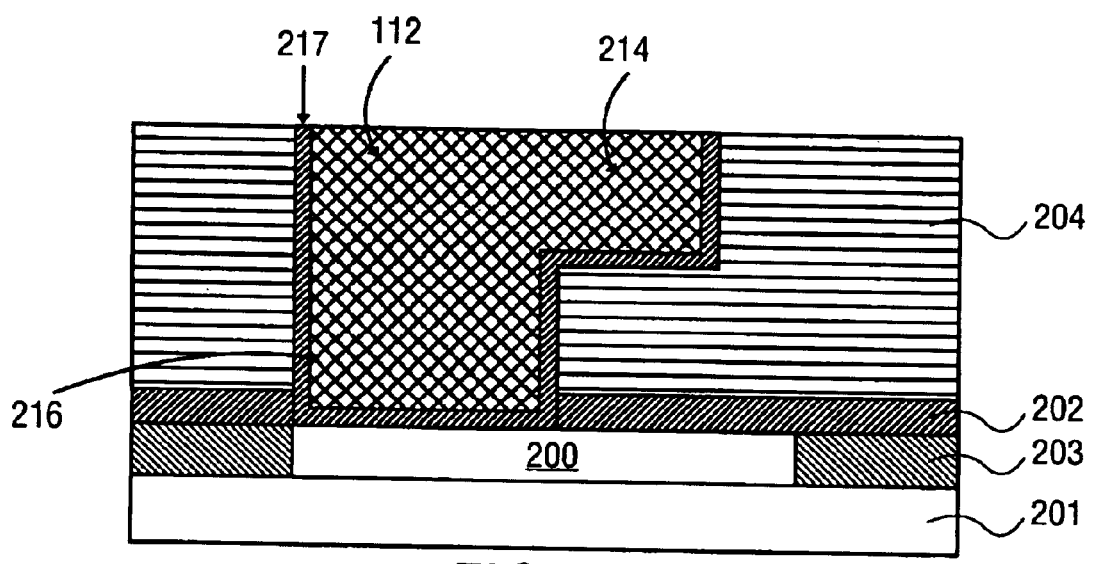

In another exemplary embodiment, after the trench 214 and the via 216 are etched, and after the SAM 206 and any other residual material used during the formation of the via and the trench are removed, the trench 214 and the via 216 are filled with a second conductive layer such as the second conductive layer 112 shown in FIG. 2J. Preferably, the second conductive layer is made of copper, and is formed using a conventional copper electroplating process. Typically, the second conductive layer 112 is formed on an insulating layer a seed layer as indicated by the layer 217 in FIG. 2J. The insulating layer can be made out of a refractory material (e.g., titanium nitride or tantalum and silicon nitride). When an excess amount of the material used to make the second conductive layer, a conventional CMP step may be applied to remove the excess material and to planarize the surface of layer 105. The final structure that is formed is shown in FIG. 2J.

Although the foregoing description has specified certain steps, materials, and equipment that may be used in such a method to make such an integrated circuit, those skilled in the art will appreciate that many modifications and substitutions may be made. For example, although the embodiments have been described in the context of making a dual damascene device, the invention is not limited to that particular application. Accordingly, it is intended that all such modifications, alterations, substitutions and additions be considered to fall within the spirit and scope of the invention as defined by the appended claims.

We claim:

1. A method of forming an integrated circuit comprising:
   forming a dielectric layer comprising a polymer on a conductive layer formed on a substrate;
   forming a sacrificial hard mask on said dielectric layer;
   patterning a first photoresist layer on said sacrificial hard mask, to define a first etched region;
   forming said first etched region into said dielectric layer while simultaneously removing substantially all of said first photoresist layer;
   covering said sacrificial hard mask and filling said first etched region with a sacrificial fill layer;
   patterning a second photoresist layer over said sacrificial fill layer, to define a second etched region; and
   forming said second etched region into said sacrificial fill layer and said dielectric layer while simultaneously removing substantially all of said second photoresist layer and at least a portion of said sacrificial fill layer; and
   removing remaining portions of said sacrificial fill layer in said first etched region and said second etched region and over said sacrificial hard mask.

2. The method as in claim 1 further comprising:
   removing said sacrificial hard mask.

3. The method as in claim 1 further comprising:
   forming an etch stop layer on the surface of said conductive layer prior to forming said dielectric layer; and
   removing a portion of said etch stop layer after forming said second etched region.

4. The method as in claim 3 further comprising:
   filing said first etched region and said second etched region with another conductive layer.

5. The method as in claim 1 wherein a plasma comprising one of a combination of nitrogen and hydrogen and a combination of nitrogen and oxygen is used to remove said first photoresist layer when forming said first etched region.

6. The method as in claim 1 wherein a plasma comprising one of a combination of nitrogen and hydrogen and a combination of nitrogen and oxygen is used to remove said second photoresist layer when forming said second etched region.

7. The method as in claim 1 wherein said sacrificial fill layer compensates for erosion of said sacrificial hard mask.

8. A method of forming an integrated circuit comprising:
   forming a dielectric layer comprising a polymer on a conductive layer formed on a substrate;
   forming a sacrificial hard mask on said dielectric layer;
   patterning a first photoresist layer on said sacrificial hard mask, to define a first etched region;
   removing a first part of said sacrificial hard mask, said first part of said sacrificial hard mask being in alignment with said first etched region;

forming said first etched region into said dielectric layer while simultaneously removing substantially all of said first photoresist layer;

covering said sacrificial hard mask and filling said first etched region with a sacrificial fill layer;

patterning a second photoresist layer over said sacrificial fill layer, to define a second etched region;

removing a part of said sacrificial fill layer and a second part of said sacrificial hard mask, said part of said sacrificial fill layer and said second part of said sacrificial hard mask being in alignment with said second etched region; and forming said second etched region into said sacrificial fill layer and said dielectric layer while simultaneously removing substantially all of said second photoresist layer and at least a portion of said sacrificial fill layer; and removing remaining portions of residual sacrificial fill layer in said first etched region and said second etched region and over said sacrificial hard mask.

9. The method as in claim 8 wherein said sacrificial hard mask is not etchable with a plasma comprising one of a combination of nitrogen and hydrogen and a combination of nitrogen and oxygen.

10. The method as in claim 8 further comprising:
removing said sacrificial hard mask.

11. The method as in claim 8 further comprising:
forming an etch stop layer on the surface of said conductive layer prior to forming said dielectric layer; and
removing a portion of said etch stop layer after forming said second etched region.

12. The method as in claim 11 further comprising:
filing said first etched region and said second etched region with another conductive layer.

13. The method as in claim 8 wherein a plasma comprising one of a combination of nitrogen and hydrogen and a combination of nitrogen and oxygen is used to remove said first photoresist layer when forming said first etched region.

14. The method as in claim 8 wherein a plasma comprising one of a combination of nitrogen and hydrogen and a combination of nitrogen and oxygen is used to remove said second photoresist layer when forming said second etched region.

15. The method as in claim 8 wherein said polymer is selected from a group consisting of polyimides, parylenes, polyarylethers, polynaphthalenes, and polyquinolines or copolymers thereof.

16. The method as in claim 8 wherein said sacrificial fill layer compensates for erosion of said sacrificial hard mask.

17. A method of forming an integrated circuit comprising:
forming a dielectric layer comprising a polymer on a conductive layer formed on a substrate;
forming a sacrificial hard mask on said dielectric layer;
patterning a first photoresist layer on said sacrificial hard mask, to define a first etched region;
removing a first part of said sacrificial hard mask using an anisotropic dry etch having a higher selectivity for said sacrificial hard mask than for said dielectric layer;
forming said first etched region into said dielectric layer while simultaneously removing substantially all of said first photoresist layer;
covering said sacrificial hard mask and filling said first etched region with a sacrificial fill layer;
patterning a second photoresist layer over said sacrificial fill layer, to define a second etched region;
removing a part of said sacrificial fill layer and a second part of said sacrificial hard mask using an anisotropic dry etch having a higher selectivity for said sacrificial hard mask than for said dielectric layer; and
forming said second etched region into said sacrificial fill layer and said dielectric layer while simultaneously removing substantially all of said second photoresist layer and at least a portion of said sacrificial fill layer; and
removing remaining portions of said sacrificial fill layer in said first etched region and said second etched region and over said sacrificial hard mask.

18. The method as in claim 17 wherein said sacrificial fill layer has a wet etch rate that is substantially higher than said dielectric layer.

19. The method as in claim 18 wherein said substantially higher is at least ten times higher.

20. The method as in claim 17 wherein said sacrificial hard mask is not etchable with a plasma comprising one of a combination of nitrogen and hydrogen and a combination of nitrogen and oxygen.

21. The method as in claim 20 wherein said plasma is used to remove said first photoresist layer when forming said first etched region and is used to remove said second photoresist layer when forming said second etched region.

22. The method as in claim 17 wherein said sacrificial fill layer compensates for erosion of said sacrificial hard mask.

* * * * *

UNITED STATES PATENT AND TRADEMARK OFFICE
CERTIFICATE OF CORRECTION

PATENT NO. : 6,774,037 B2
DATED : August 10, 2004
INVENTOR(S) : Hussein et al.

It is certified that error appears in the above-identified patent and that said Letters Patent is hereby corrected as shown below:

Title page,
Item [75], Inventors, delete "Turklot" and insert -- Turkot --.

Signed and Sealed this

Ninth Day of August, 2005

JON W. DUDAS
*Director of the United States Patent and Trademark Office*